(12) United States Patent
Silva

(10) Patent No.: US 6,356,007 B1
(45) Date of Patent: Mar. 12, 2002

(54) BI-STABLE SNAP OVER ACTUATOR

(75) Inventor: Gabriel Silva, Liverpool, NY (US)

(73) Assignee: Young & Franklin, Inc., Liverpool, NY (US)

( * ) Notice: Subject to any disclaimer, the term of this patent is extended or adjusted under 35 U.S.C. 154(b) by 0 days.

(21) Appl. No.: 09/580,701

(22) Filed: May 30, 2000

(51) Int. Cl.$^7$ .............................................. H01L 41/08
(52) U.S. Cl. ......................... 310/331; 310/328; 310/330
(58) Field of Search ................................ 310/328, 330, 310/331, 332

(56) References Cited

U.S. PATENT DOCUMENTS

| | | | |
|---|---|---|---|
| 2,587,482 A | * 2/1952 | Keller | 310/328 |
| 2,916,578 A | * 12/1959 | Crownover | 310/330 |
| 3,264,884 A | 8/1966 | Brooker | |
| 3,292,019 A | * 12/1966 | Hsu et al. | 310/328 |
| 4,395,651 A | * 7/1983 | Yamamoto | 310/330 X |
| 4,538,087 A | * 8/1985 | Germano et al. | 310/332 |
| 4,672,257 A | * 6/1987 | Oota et al. | 310/328 |
| 5,286,199 A | * 2/1994 | Kipke | 310/328 X |
| 5,632,841 A | 5/1997 | Hellbaum et al. | |
| 5,639,850 A | 6/1997 | Bryant | |
| 5,870,806 A | 2/1999 | Black, Jr. | |

OTHER PUBLICATIONS

"Thunder Piezoceramic Actuators and Sensors", *High Tech Ceramics News*, vol. 10, No. 9 (Jan. 1999).

* cited by examiner

*Primary Examiner*—Mark O. Budd
(74) *Attorney, Agent, or Firm*—Wall, Marjama & Bilinski, LLP

(57) ABSTRACT

A quick acting bi-stable actuator having a piezoelectric trigger for moving the snap actuator past its snap over equilibrium that includes a stem that is mounted for axial reciprocation in a pair of bearings and a bi-stable snap over actuator centrally attached to the stem for movement therewith. The rim of the snap over actuator is loosely held within a cavity so that the snap over actuator is generally radially disposed with regard to the axis of the stem. A piezoelectric actuator is arranged to support the snap over actuator close to one of its snap over equilibrium positions and acts as a trigger when energized to move the snap over actuator past the critical equilibrium point whereby the snap over actuator moves rapidly to a second stable position. This, in turn, moves the stem axially from a first home position to an extended position to actuate a valve or the like.

26 Claims, 5 Drawing Sheets

BI-STABLE SNAP OVER ACTUATOR

FIELD OF THE INVENTION

This invention relates generally to a bi-stable snap over actuator having a piezoelectric trigger for moving the snap actuator past its snap over equilibrium points whereby the actuator can be moved rapidly from one stable position into the other stable position.

BACKGROUND OF THE INVENTION

Bi-stable snap actuators have been known and used for some time for various purposes. Typically, this type of device includes a relatively thin arcuate shaped member which has an outer rim section and an inner resilient diaphragm section. With the rim section held in a relatively stationary position, the arcuate shaped resilient diaphragm can be moved from a first stable condition to an equilibrium point, herein referred to as the snap over point, wherein the energy stored in the member forces the diaphragm to rapidly snap over into a second stable position. The energy stored in the snap over actuator can be put to use in cycling such devices as valves, switches and the like.

Snap over actuators can take the form of discs, membranes, beams and the like. When in a first stable condition, a sufficient force can be applied to the member so that it buckles or deforms to a critical point and then rapidly snaps over into a second stable position. The snap over process is reversible and the device can be returned to original stable position by applying a force in the opposite direction. Since two stable or equilibrium states are obtainable, and a maximum critical load is required to snap the member in either direction, the member can be used as a switch, detent, actuator or locking device for many types of applications requiring this type of cycling. The term snap actuator will be used herein to refer to a snap over device suitable for use in all of these applications. A snap over actuator of this type for positioning a valve stem is disclosed in U.S. Pat. No. 3,264,884.

Snap over actuators found in the prior art are generally not very compatible with current day control equipment In addition, the mechanical force required to cycle the device between the stable positions are sometimes difficult to apply and can be relatively high. Because these prior art devices rely strictly upon a mechanically applied force for triggering a snap over action, the repeatability of the action may vary, thus limiting the number and types of applications in which the device can be employed.

SUMMARY OF THE INVENTION

It is therefore an object of the present invention to improve snap over actuators.

It is a further object of the present invention to improve the response of a snap over actuator.

A still further object of the present invention is to improve the reliability of snap over actuators.

Another object of the present invention is to reduce the amount of force needed to move a snap over actuator over its snap over equilibrium point.

These and other objects of the present invention are attained by a quick acting bi-stable actuator that includes a bi-stable snap over actuator that is arranged to move between two stable positions and at least one piezoelectric actuator that is arranged to act as a trigger with regard to the snap over actuator to hold the snap over actuator in one stable position at slightly below the snap over equilibrium position. A current is applied to the piezoelectric actuator which reacts to move the snap over actuator past the critical snap over equilibrium point whereupon the snap over actuator moves from a first stable position to a second stable position. In one embodiment of the invention piezoelectric actuators are mounted on either side of the snap actuator and are adapted to trigger the snap over actuator in both directions.

BRIEF DESCRIPTION OF THE DRAWING

For a better understanding of the these and other objects of the present invention, reference will be made to the following detailed description of the invention which is to be read in association with the accompanying drawings, wherein.

DETAILED DESCRIPTION OF THE INVENTION

Figure 1:
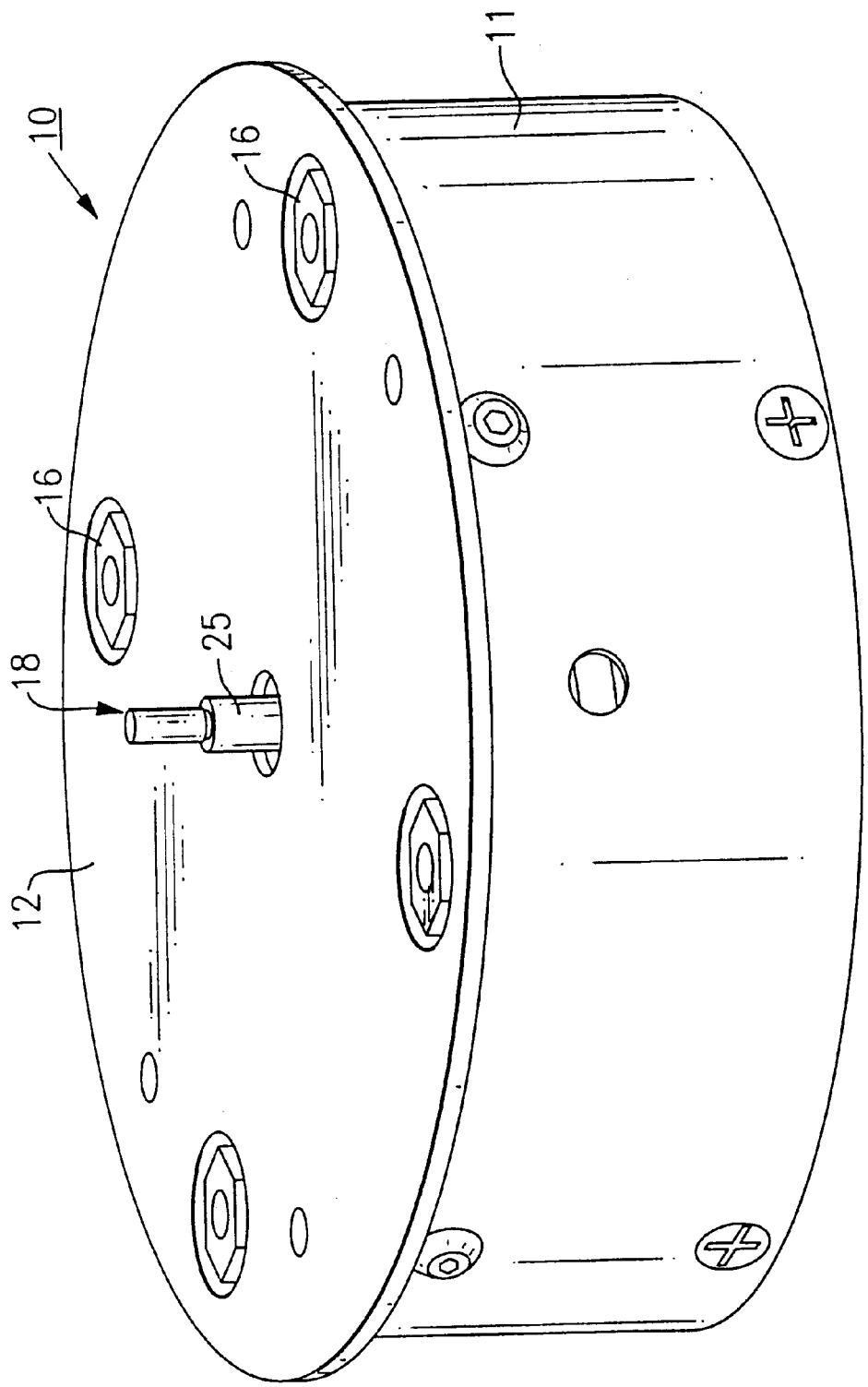
FIG. 1 is a perspective view of a bi-stable snap over actuator embodying the teachings of the present invention.
Figure 2:
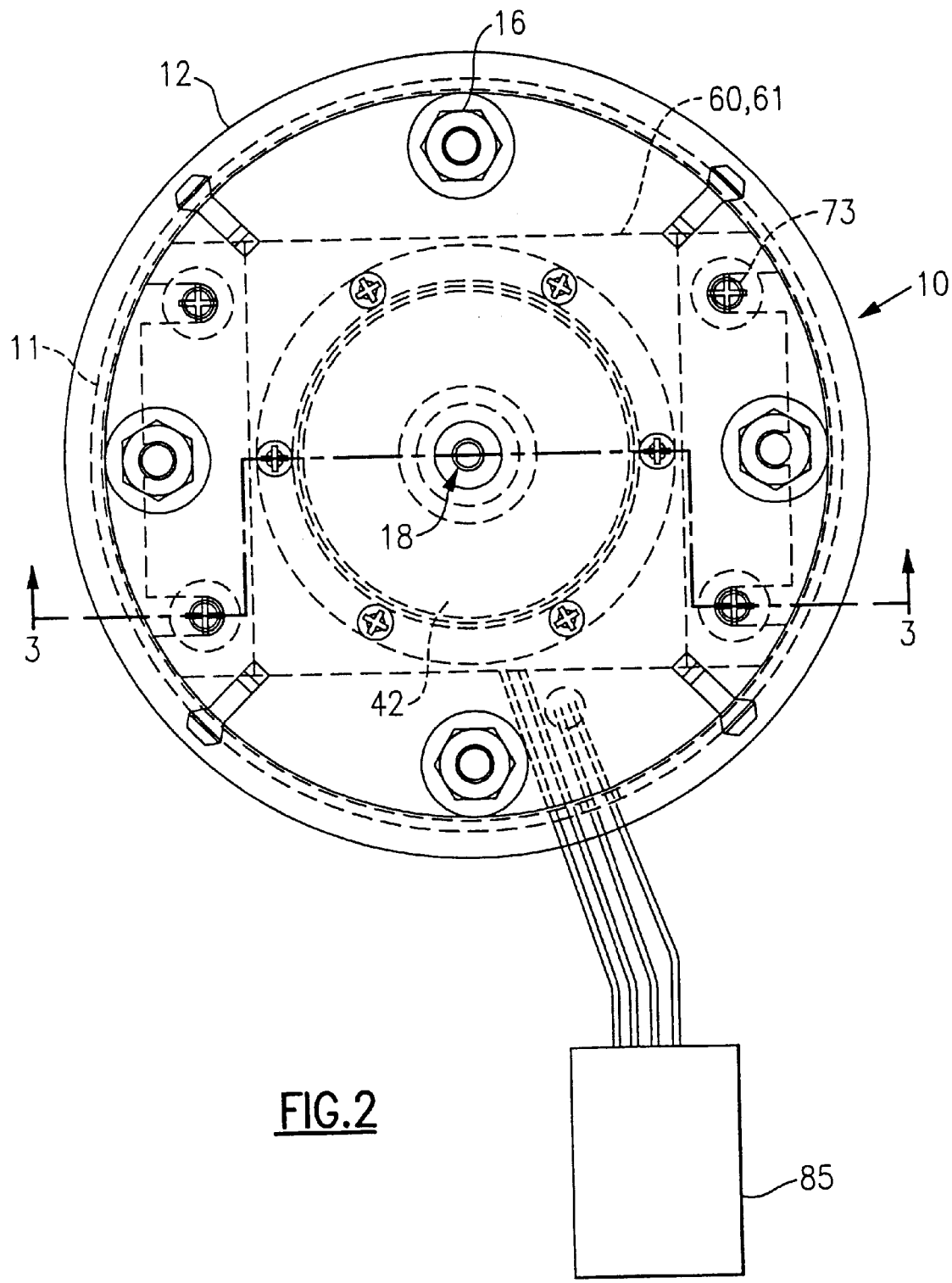
FIG. 2 is a top view of the actuator shown in FIG. 1.
Figure 3:
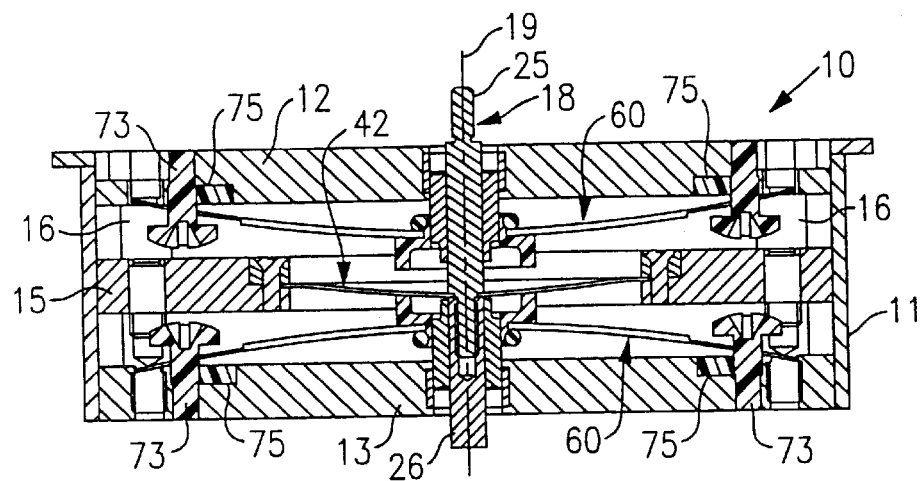
FIG. 3 is a sectional view taken along lines 3—3 in FIG. 2.

Turning now to FIGS. 1–4, there is illustrated a quick acting bi-stable actuator that embodies the teachings of the present invention. The device is contained within a circular housing, generally referenced 10, that includes a cylindrical shell 11, a top cover 12 and a bottom cover 13. A center plate 15 is mounted centrally in the shell in parallel alignment with the top and bottom covers upon spacer bolts 16. A two piece stem 18 is vertically disposed within the housing in coaxial alignment with axis 19 of the shell. The stem includes an upper section 20 having a threaded shank 21 that is threaded into a tapped hole 22 located in the lower section 23 of the stem. The distal end 25 of the stem protrudes outwardly from the housing through the top cover 12 while the proximal end of the stem 26 protrudes outwardly from the housing through the bottom cover 13. The stem is slidably mounted for reciprocation along the axis of the housing in upper bearing member 30 and lower bearing member 31. The bearing members are threaded into upper insert 33 and lower insert 34.

Figure 7:
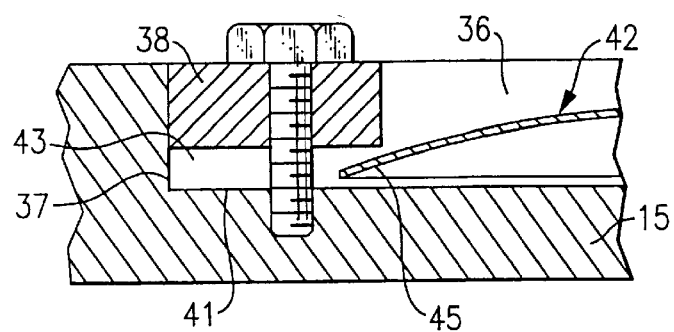
FIG. 7 is a further enlarged partial side view in section showing the rim of the snap over actuator mounted within the retaining housing.

As best shown in FIG. 7, the center plate 15 of the housing contains a central opening 36 through which the stem passes. A square shoulder 37 is formed in the wall of the opening and an annular ring 38 is contained within the shoulder. The ring is held in place by a series of screws 40 that are threaded through the ring and into the center plate so that the ring can be adjustably supported some distance above the horizontal floor 41 of the shoulder.

A snap over actuator 42 is mounted upon the stem 18 between the two sections 20 and 23. A clearance hole is provided in the center of the actuator that has a diameter such that the shank 21 of the upper stem section 20 can pass therethrough but small enough so that the center of the actuator is clamped between the sections when the top section is threaded down tightly within the bottom section the stem. Although the snap over actuator can take any suitable shape, the actuator preferably is a circular disc that radiates outwardly in all directions from the axis of the stem. The actuator can be fabricated of any suitable resilient material that can be preshaped into an arc and which can snap over from between one stable position and a second stable position by a directional force applied to the center section of the device. As is well known, when the snap over force is applied, the disc will deform to a critical snap over equilibrium position and then quickly snap over into the inverted second stable position thereby releasing the energy stored in the member. The stored energy and the distance of displacement of the disc during the snap over process can be used for any number of useful purposes such as cycling a valve, or a switch, or any other similar task. Because the snap over process takes place in a very short period of time once the equilibrium actuation of the device being controlled can be accomplished rapidly.

The ring 38 is raised some distance above the floor 41 of the shoulder 37 to form a circular cavity 43. The rim section 45 of the snap over disc is loosely held within the cavity. By loosely retaining the rim of the disc within the cavity, most of the stored energy in the disc will be available for release during the snap over process rather than being dissipated into the center plate and ring assembly.

Figure 4:
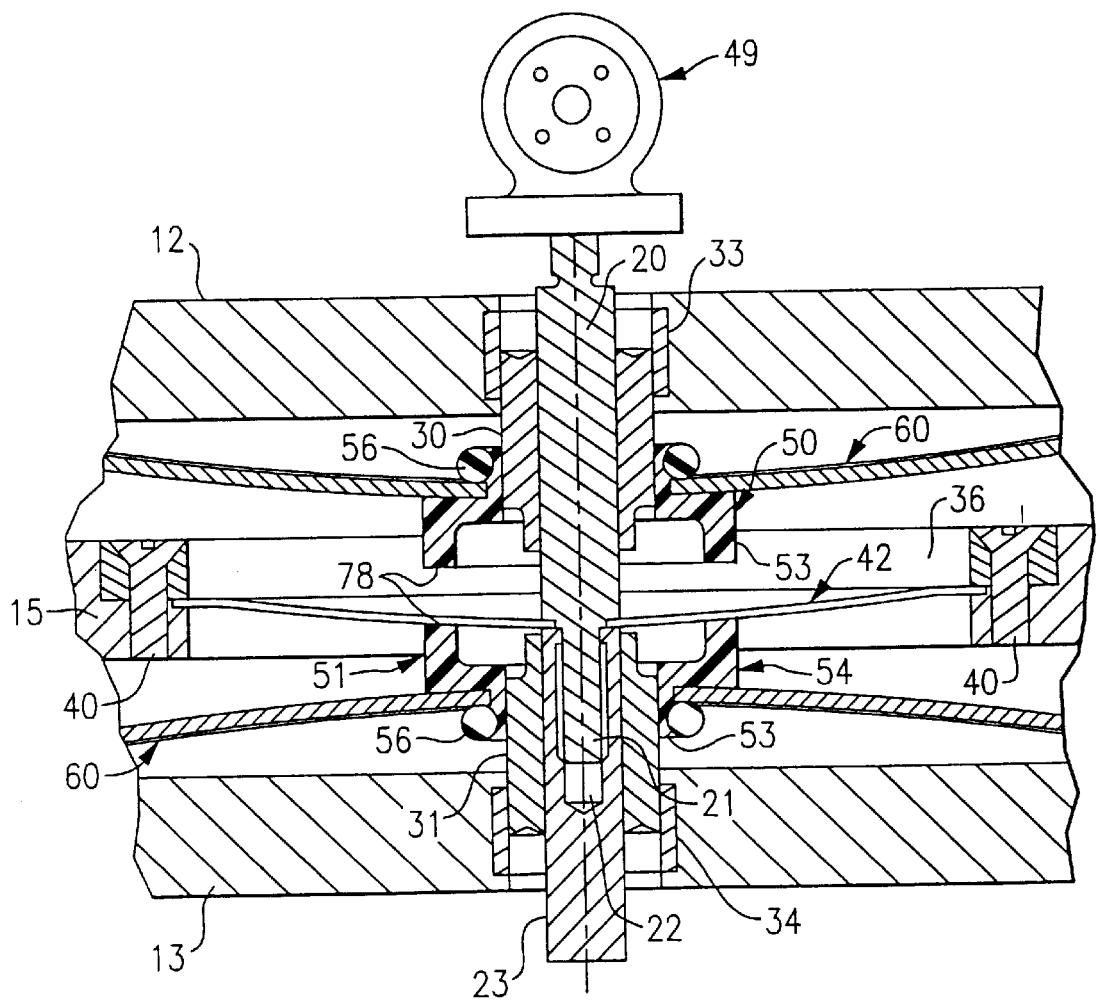
FIG. 4 is an enlarged partial view in section further illustrating the stem assembly employed in the present invention.

As should be evident from the description above, the stem 18 that is attached to the snap over disc can be rapidly moved some distance axially within the bearing members 30 and 31 during each snap over cycle. This movement can be translated through the stem to any type device that is connected to the stem such as a valve 49 as shown in FIG. 4. The distal end of the stem is threaded to accommodate a valve stem or the like.

Figure 8:
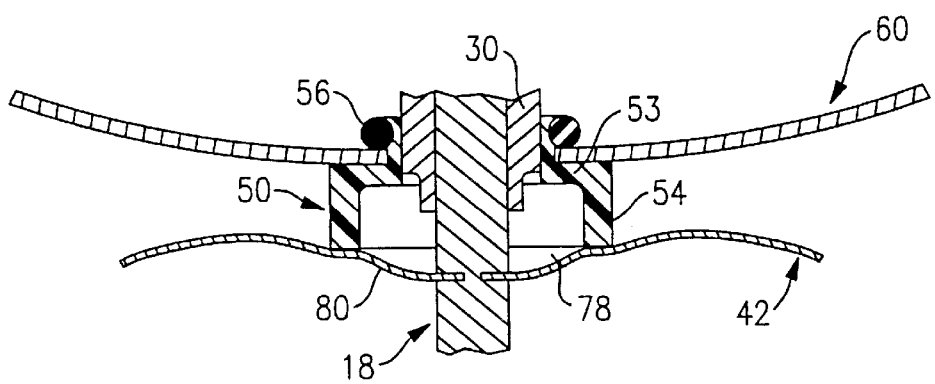
FIG. 8 is an enlarged partial view in section showing the snap over actuator in a stable position in contact against a slide element.

Slide elements 50 and 51 are slidably retained on the bearing members 30 and 31, respectively, located on either side of the snap over actuator. As illustrated in FIG. 8, each slide is a circular member having a hub 53 that encircles an adjacent bearing member and an annular flange section 54 that opens toward the snap over actuator 42. A groove is formed in the raised portion of the hub for receiving therein a retaining ring 56.

Figure 5:
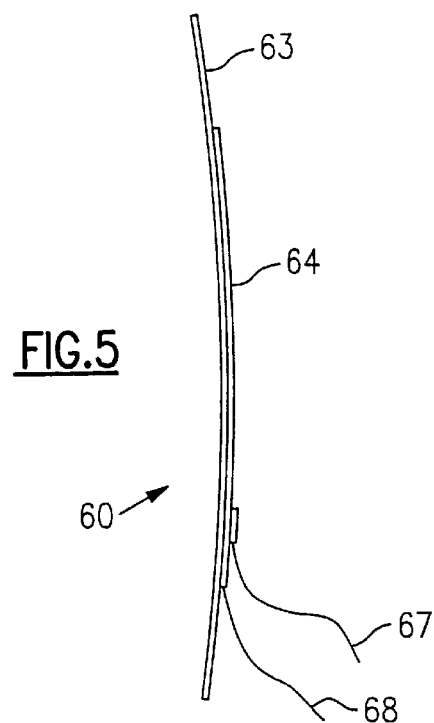
FIG. 5 is a top view showing one of the piezoelectric actuators employed in the practice of the present invention.
Figure 6:
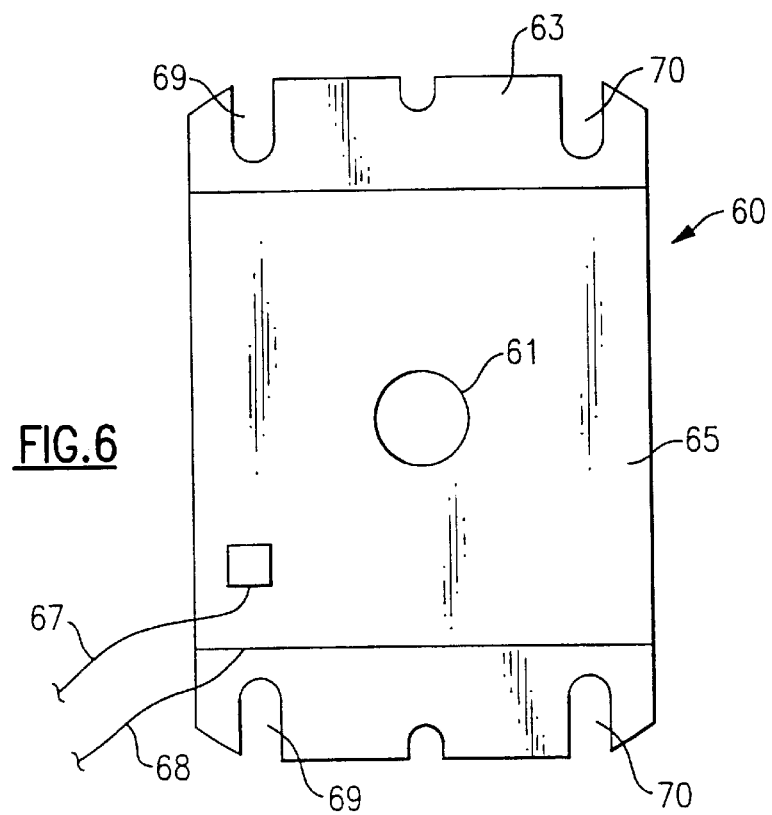
FIG. 6 is a side view of the piezoelectric actuator illustrated in FIG. 5.

A piezoelectric actuator 60 containing a centrally located hole 61 is seated upon the hub of each slide element and is held against the flange of the retaining ring 56 as shown in FIG. 8. The construction of each piezoelectric actuator is shown in greater detail in FIGS. 5 and 6 and more thoroughly described in U.S. Pat. No. 5,632,841 to Heilbaum et al. To the extent necessary to better understand the structure and function of the piezoelectric actuator, the disclosure in the Heilbaum patent is herein incorporated by reference. Each piezoelectric actuator includes a piezoelectric layer 63 that is mounted upon a rectangular shaped prestressed layer 65. The piezoelectric layer is formed of a commercially available material provided by Aura Ceramics under the trade designation C3900. The prestressed layer is formed of a mechanically strong thermoplastic such as polyamide or a brazed alloy. The piezoelectric layer is covered on both sides by an electrode layer. The electrode layers are connected to a controller 85 (FIG. 2) by means of leads 67 and 68. The controller is arranged to apply current to a selected trigger actuator. A pair of elongated slotted holes 69 and 70 are provided in each end of the prestressed layer 65. As will be described below, the slots are arranged to receive mounting bolts to enable the piezoelectric actuator to be mounted within the housing.

The prestressed layer of each piezoelectric actuator is arcuate shaped and is capable of being displaced rapidly when an electrical current is applied over the piezoelectric layer. However, these devices cannot deliver the amount of displacement that is provided by the snap over actuator 42 and therefore the number and types of applications in which it can be used is rather limited. The piezoelectric actuators are employed in the present invention as triggers that are arranged to hold the snap over actuator in both stable positions and support the disc at just below the critical snap over point. Upon the application of current to a selected one of the trigger actuators, the disc is moved past the equilibrium point and is snapped over to the opposite stable position.

Referring once again to FIG. 3, the slotted openings in the opposing ends of each piezoelectric actuator are adapted to receive four mounting screws 73 that are threaded into the top and bottom covers of the housing 10. The screws 73 are fabricated of a non-conducting material and are arranged to pass through nonconducting spacers 75. As illustrated, the opposed ends of each piezoelectric actuator are restrained between the head of the bolts and the underlying spacers. Here again, the actuators are loosely held in assembly to prevent excessive loss of energy to the supporting structure. The thickness of the spacers can be adjusted to place the bottom surface 78 of each slide at a location that is just below the critical snap over equilibrium point of the snap over actuator when no current is applied to the trigger actuator. The spacers thus act as stops which limit the amount of travel afforded the snap over disc when in either stable position.

FIG. 8 illustrates slide 50 in holding contact with the snap over actuator 42. Under the combined action of the slide and the piezoelectric actuator 60, the upward movement of the snap over actuator is arrested in a stable position close to the snap over point. At this time, a slight cusp 80 is formed in the midsection of the actuator by the annular nose section of the slide elements. Accordingly, the snap over actuator is now in a condition wherein a slight movement of the slide toward the disc actuator will trigger the snap over action whereupon the actuator will move quickly to the opposite stable position. As can be seen, the activity of the two piezoelectric actuators can be controlled through the controller 85 (FIG. 2) to position the stem so as to selectively control the opening or closing of a valve such as valve 49 or any similar device.

Figure 9:
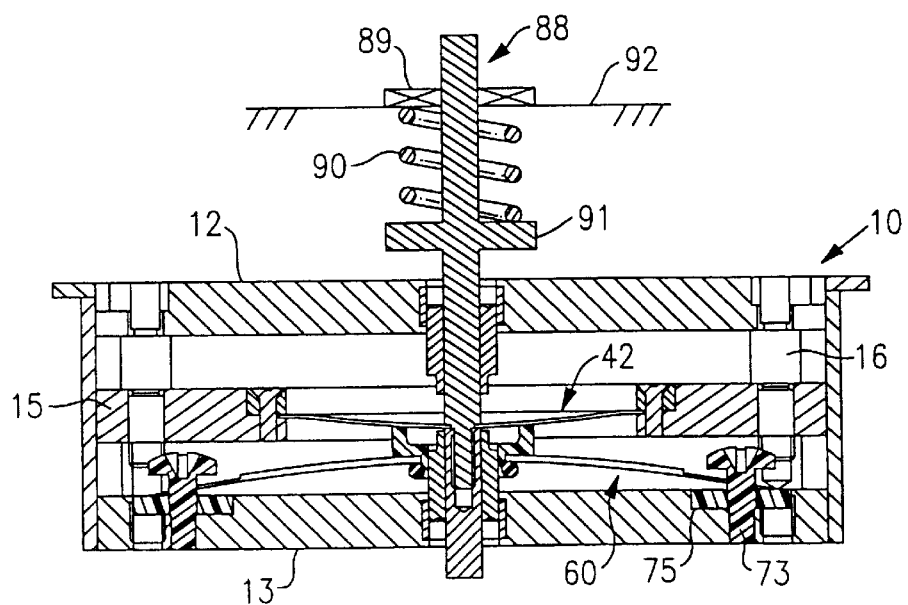
FIG. 9 is a side view in section showing a further embodiment of the present invention.

FIG. 9 is a further embodiment of the invention wherein like reference numbers are used to indicate like components as those used in regard to the prior embodiment of the invention. In this further embodiment, a single piezoelectric actuator 60 is utilized in conjunction with the snap over actuator 42 to selectively trigger the snap over actuator so as to move in an upward direction. Here the stem 88 has been modified so that the stem is returned to its original position once the current is removed from the piezoelectric trigger actuator. The extended distal end of the stem is slidably contained within a bearing 89. A spring 90 is wound about the distal end of the stem and is mounted between a flange 91 and a stationary element 92. As can be seen in this embodiment of the invention, when the snap over actuator is cycled by the piezoelectric trigger actuator, the stem moves upwardly to complete a desired task such as cycling a switch or the like. At this time, the spring is compressed between the flange and the stationary member. Removal of the current from the trigger actuator allows the compressed spring to unload, returning the stem to its original home position.

Although a return spring is illustrated in this further embodiment of the invention, a solenoid may be used in its stead. The solenoid might be arranged to hold the stem extended for a desired period of time before the solenoid releases the stem and returns it to its original position.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A quick acting bi-stable actuator that includes:
   a stem slidably mounted within at least one bearing for reciprocation along the axis of said stem,
   a bi-stable snap over actuator attached to said stem, the central axis of said snap over actuator being coaxially aligned with the axis of said stem, said snap actuator having an outer periphery that is radially disposed with respect to the axis of said stem,
   engaging means for retaining the outer periphery of the snap over actuator so that the snap over actuator can move with said stem to snap between a first stable position and a second stable condition,
   a pair of spaced apart piezoelectric actuators, each being mounted in a slide member, said slide members being slidably contained on said stem on either side of the snap over actuator so that a first slide member contacts one side of the snap over actuator when the snap over actuator is in said first stable position and the other slide member contacts the other side of the snap actuator when the snap over actuator is in said second stable position, and
   control means for selectively applying an electrical current to a piezoelectric actuator to displace the selected piezoelectric actuator axially a sufficient distance to move the snap over actuator past the snap over equilibrium point whereby the snap over actuator moves to the opposite stable position.

2. The quick acting actuator of claim 1 wherein said stem is mounted in spaced apart bearings.

3. The quick acting actuator of claim 2 wherein said bearings are mounted in an enclosed housing.

4. The quick acting actuator of claim 3 wherein one end of said stem protrudes outwardly from one wall of said housing.

5. The quick acting actuator of claim 4 wherein the opposite end of said stem protrudes from another wall of said housing.

6. The quick acting actuator of claim 1 wherein one end of said stem includes a connecting means for attaching said stem to a valve for opening and closing said valve.

7. The quick acting actuator of claim 1 wherein said engaging means includes a cavity for loosely housing the rim of said snap over actuator.

8. The quick acting actuator of claim 7 wherein said snap over actuator is a disc.

9. The quick acting actuator of claim 1 that further includes electrical insulator means for supporting the periphery of each piezoelectric actuator.

10. The quick acting actuator of claim 9 wherein each piezoelectric actuator is rectangular in shape and contains a series of slotted holes formed in opposing ends thereof for receiving thread fasteners formed of an insulating material.

11. The quick acting actuator of claim 10 that further includes seats formed of an electrical insulating material upon which the piezoelectric actuators rest.

12. The quick acting actuator of claim 1 wherein each slide member contains an annular noise section that is arranged to contact one side of said snap over actuator.

13. A quick acting bi-stable piezoelectric actuator that includes a stem slidably mounted within at least one bearing for reciprocation along the axis of said stem,
    a bi-stable snap over actuator attached to said stem that has a central axis that is coaxially aligned with the axis of said stem and an outer periphery that is radially disposed with regard to the axis of said stem,
    engaging means for retaining the outer rim of said snap over actuator so that said snap over actuator can move between a first stable position and a second stable position,
    a piezoelectric actuator mounted upon a slide member that is slidably contained upon said stem so that the slide member contacts one side of said snap over actuator when said snap over actuator is in one stable position,
    control means for applying a current to said piezoelectric actuator to displace said piezoelectric actuator a sufficient distance to move the snap over actuator past the snap over equilibrium point whereby the snap actuator moves to the second stable position, and
    means for returning the snap actuator back to the first stable position.

14. The quick acting actuator of claim 13 wherein said stem is mounted in spaced apart bearings.

15. The quick acting actuator of claim 14 wherein said bearings are mounted in an enclosed housing.

16. The quick acting actuator of claim 15 wherein one end of said stem protrudes outwardly from one wall of said housing.

17. The quick acting actuator of claim 16 wherein the opposite end of said stem protrudes from another wall of said housing.

18. The quick acting actuator of claim 13 wherein one end of said stem includes a connecting means for attaching said stem to a valve for opening and closing said valve.

19. The quick acting actuator of claim 13 wherein said engaging means includes a cavity for loosely housing the rim of said snap over actuator.

20. The quick acting actuator of claim 19 wherein said snap over actuator is a disc.

21. The quick acting actuator of claim 13 that further includes electrical insulator means for supporting the periphery of the piezoelectric actuator.

22. The quick acting actuator of claim 21 wherein the piezoelectric actuator is rectangular in shape and contains a series of slotted holes formed in opposing ends thereof for receiving thread fasteners formed of an insulating material.

23. The quick acting actuator of claim 22 that further includes seats formed of an electrical insulating material upon which the piezoelectric actuators rest.

24. The quick acting actuator of claim 13 wherein the slide member contains an annular noise section that is arranged to contact one side of said snap over actuator.

25. The apparatus of claim 13 wherein the means for retaining the snap over actuator to the first stable position is a spring.

26. The apparatus of claim 13 wherein the means for returning the snap over actuator to the first stable position is a solenoid.

* * * * *